(12) United States Patent
Shia et al.

(10) Patent No.: US 7,700,246 B2
(45) Date of Patent: Apr. 20, 2010

(54) CONDUCTIVE LITHOGRAPHIC POLYMER AND METHOD OF MAKING DEVICES USING SAME

(75) Inventors: Rebecca Shia, Bellevue, WA (US); Jack Tsung-Yu Chen, Taipei (TW)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/881,030

(22) Filed: Jul. 25, 2007

(65) Prior Publication Data

US 2007/0269743 A1 Nov. 22, 2007

Related U.S. Application Data

(62) Division of application No. 10/938,161, filed on Sep. 9, 2004, now Pat. No. 7,279,268.

(51) Int. Cl.
G03F 7/09 (2006.01)
G03F 7/038 (2006.01)
H01L 21/768 (2006.01)

(52) U.S. Cl. .......................... 430/14; 430/18; 430/311; 430/285.1; 428/546

(58) Field of Classification Search ....................... None
See application file for complete search history.

(56) References Cited

U.S. PATENT DOCUMENTS

| | | | |
|---|---|---|---|
| 3,306,830 A | 2/1967 | Bittrich et al. | |
| 3,791,858 A | 2/1974 | McPherson et al. | |
| 3,997,344 A | 12/1976 | Schlesinger et al. | |
| 4,650,288 A | 3/1987 | White | |
| 5,300,208 A * | 4/1994 | Angelopoulos et al. | 205/50 |
| 5,427,841 A * | 6/1995 | De Leeuw et al. | 428/209 |
| 5,492,863 A | 2/1996 | Higgins, III | |
| 5,702,566 A | 12/1997 | Tsui | |
| 5,962,148 A | 10/1999 | Nishimura et al. | |
| 6,078,100 A | 6/2000 | Duesman et al. | |
| 6,132,644 A * | 10/2000 | Angelopoulos et al. | 252/500 |
| 6,197,881 B1 | 3/2001 | Cosnier | |
| 6,214,737 B1 | 4/2001 | Lyons et al. | |
| 6,254,758 B1 | 7/2001 | Koyama | |
| 6,300,049 B2 | 10/2001 | Eichorst et al. | |
| 6,319,643 B1 | 11/2001 | Singh et al. | |
| 6,331,356 B1 | 12/2001 | Angelopoulos et al. | |
| 6,440,654 B1 | 8/2002 | Anderson et al. | |
| 6,638,410 B2 | 10/2003 | Chen et al. | |
| 6,699,396 B1 | 3/2004 | Drewery | |
| 6,723,444 B2 | 4/2004 | Kobayashi et al. | |
| 2002/0022191 A1 | 2/2002 | Lamotte et al. | |
| 2002/0063222 A1 | 5/2002 | Huang et al. | |
| 2002/0150838 A1 | 10/2002 | Zhang et al. | |

FOREIGN PATENT DOCUMENTS

| | | |
|---|---|---|
| EP | 0130615 | 1/1985 |
| EP | 0591951 | 4/1994 |
| EP | 615256 | 9/1994 |
| EP | 0753550 | 1/1997 |
| EP | 1344788 | 9/2003 |
| JP | 03137121 | 6/1991 |
| JP | 05-320542 | 12/1993 |
| JP | 05/320542 A * | 12/1993 |
| JP | 2003-160745 | 6/2003 |
| JP | 2003-160745 A * | 6/2003 |
| WO | WO9709379 | 3/1997 |
| WO | WO 200133649 A1 * | 5/2001 |
| WO | PCT/US2005/030407 | 8/2005 |
| WO | WO-2006031411 A2 | 3/2006 |

OTHER PUBLICATIONS

Sartomer Product Bulletin, "Epoxy Acrlyate Oligomers", Exton, Pennsylvania, obtained from Wayback Machine at http://web.archive.org/web/20000816192140/www.sartomer.com/wpapers/3400.pdf, dated Feb. 5, 2003 by Wayback Machine as available online, date appears to be Jun. 1997, 13 pages including wayback web address page.*

"Epoxy Resins", Kirk-Othmer Encyclopedia of Chemical Technology (2004 article), abstract and PDF pp. 347,380-383, 464,471, from Wlly inter Science, at http://www.mrw.interscience.wiley.com/emrw/9780471238966/kirk/article/epoxgann.a01/curent/ab . . . .*

Andrzejewska et al, Journal of Polymer Science: part A: Polymer CHemistry, vol. 36, pp. 665-673 (1998) (Who Wlley & Sons, Inc.*

PTO-06-4778, Translation of D. Schmid, EP 0130615 A2 by FLS, Inc for the USPTO, Washington, D.C>, Jun. 2006, coversheet and 13 pages.*

Drury et al "Low-cost all-polymer integrated Circuits", Applied PHysics Letters, vol. 73, No. 1, pp. 108-110, Jul. 6, 1998.*

Monroe et al,. Photoinitiators for free-radical-initiated photoimaging systems. Chemical Reviews, vol. 93, No. 1, Jan.-Feb. 1993. p. 435-448.*

"PCT/US2005/030407", Search Report (Feb. 23, 2006), 2 pages.

Biscoff, Gerlinde , et al., "Photoconductivity of Polymers with Conjugated Double Bonds", *Dialelctric Materials, Measurements with Applications, Sixth International Conference, Manchester*, UK, (Sep. 10, 1992), 459-462.

Evans, P.S.A. , et al., "Component Attachment in Lithographic Film Circuits", *IEEE CPMT Int'l Electronics Manufacturing Technology Symposium*, (1999), 282-286.

(Continued)

*Primary Examiner*—Cynthia Hamilton
(74) *Attorney, Agent, or Firm*—Blakely, Sokoloff, Taylor & Zafman LLP

(57) ABSTRACT

A conductive photolithographic film and method of forming a device using the conductive photolithographic film. The method includes depositing a conductive photolithographic film on a top surface of a substrate; and patterning the conductive photolithographic film to create a desired circuit pattern using a lithographic process. The conductive photolithographic film comprising about 50% to about 60% of a mixture of epoxy acrylate, a thermal curing agent, and a conductive polymer; about 20% to about 30% of a lithographic reactive component; about 10% to about 15% of a photo-active material; and about 3% to about 5% of additives that enhance conductivity of the conductive photolithographic polymer.

2 Claims, 5 Drawing Sheets

OTHER PUBLICATIONS

MacDiarmid, Alan G., "" Synthetic Metals": A Novel Role for Organic Polymers (Nobel Lecture)", *Angew, Chem. Int. Ed.*, (2001), 2581-2590.

Ramsey, B.J., et al., "Conductive Lithographic Films", *IEEE International Symposium on Electronics and the Environment*, San Francisco, CA, (May 5-7, 1997), 252-257.

\* cited by examiner

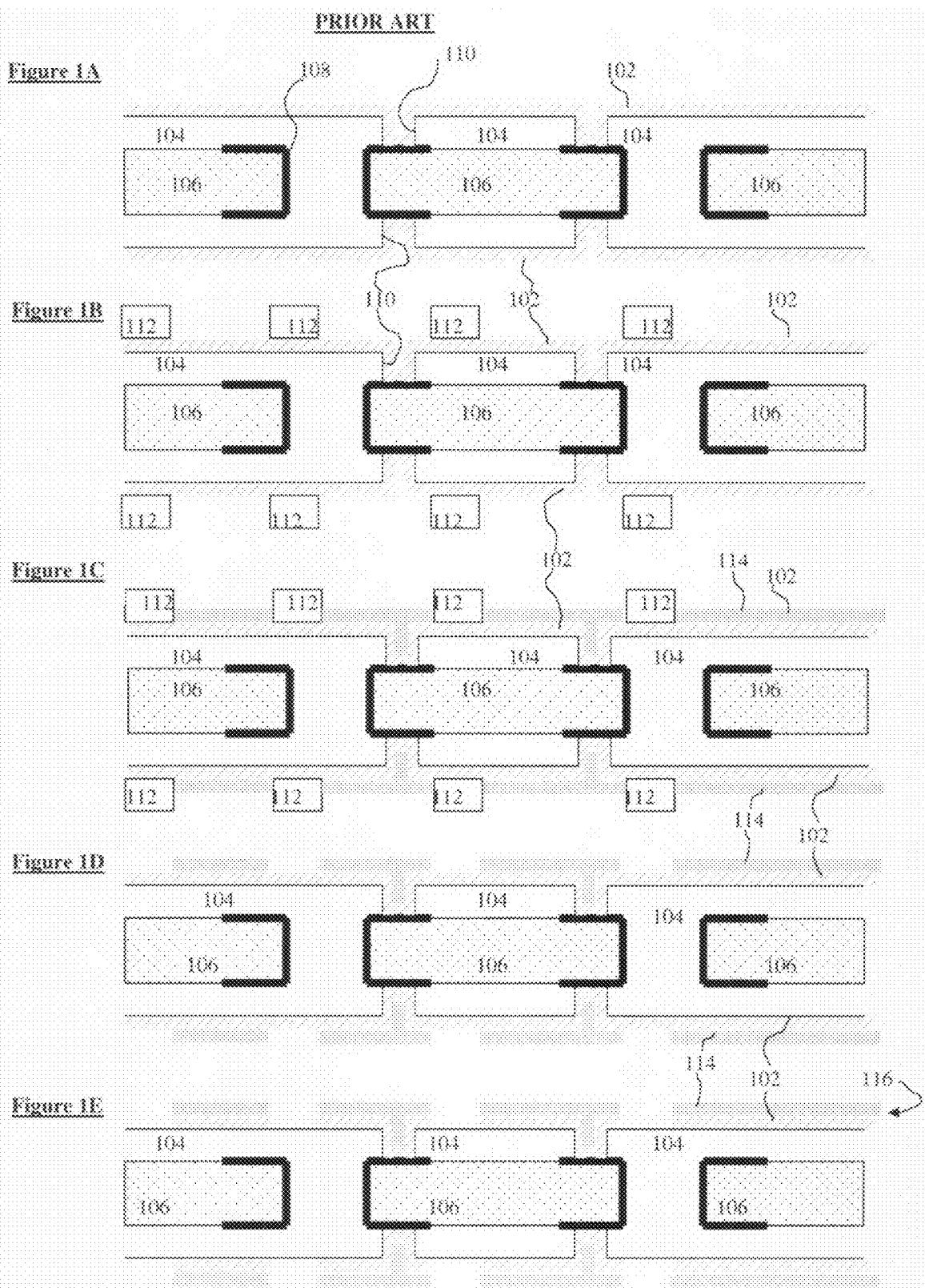

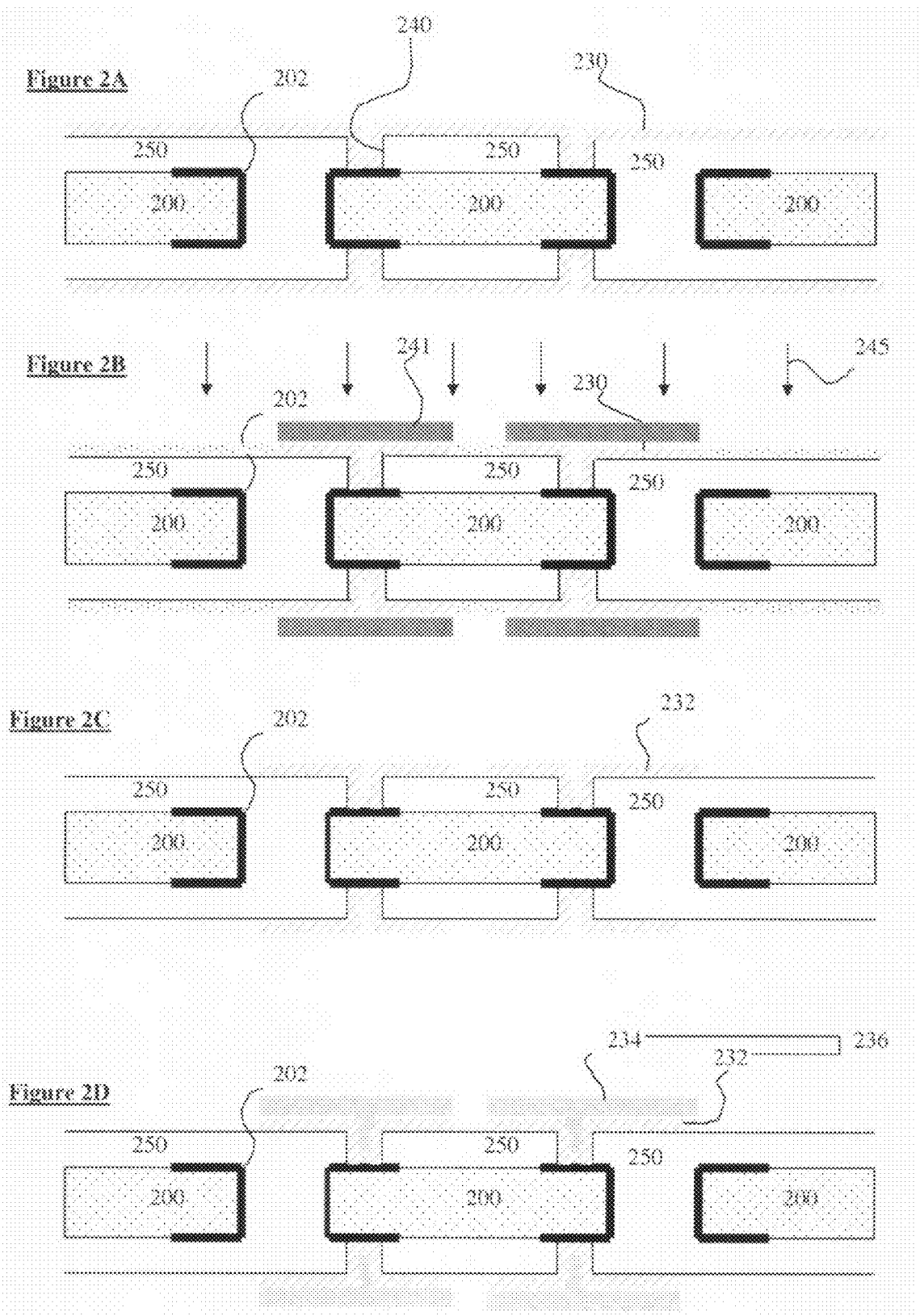

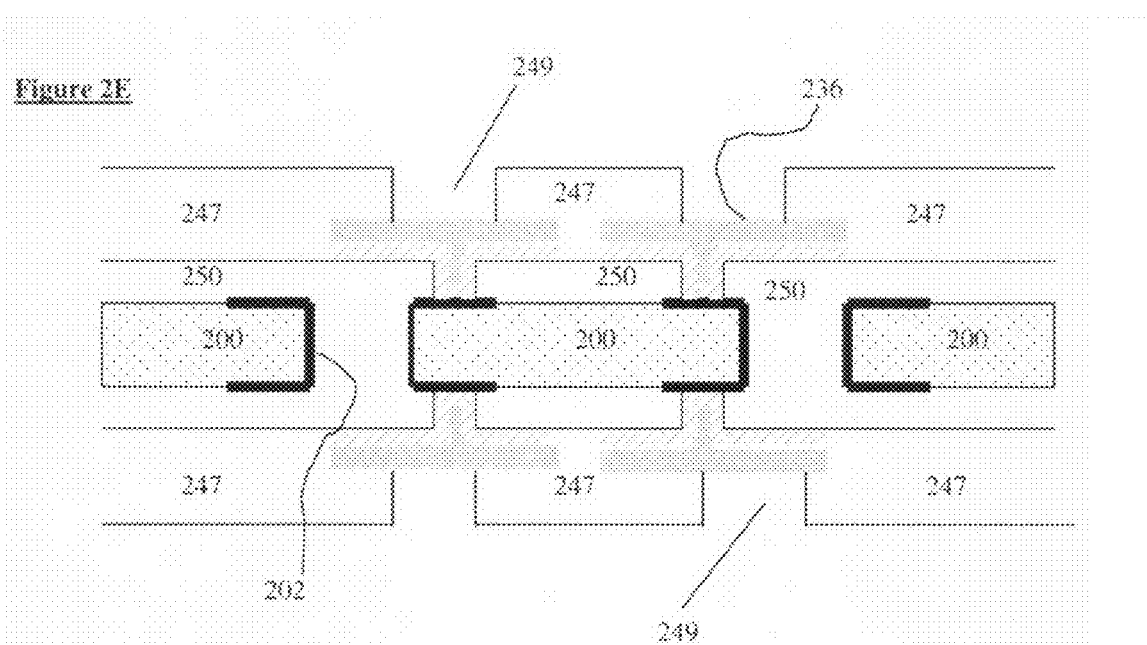

CONDUCTIVE LITHOGRAPHIC POLYMER AND METHOD OF MAKING DEVICES USING SAME

The present application is a divisional of U.S. patent application Ser. No. 10/938,161, filed Sep. 9, 2004, now U.S. Pat. No. 7,279,268 entitled "A Conductive Lithographic Polymer and Method of Making Devices Using Same", currently allowed. The U.S. patent application Ser. No. 10/938,161 is hereby incorporated herein by reference.

BACKGROUND

Embodiments of the present invention relate to a conductive lithographic polymer and method of making interconnection and conductive features for devices incorporating the conductive lithographic polymer.

An integrated circuit is an interconnected ensemble of devices formed within a semiconductor material and within a dielectric material that overlies a surface of the semiconductor. Devices which may be formed within the semiconductor include transistors, bipolar transistors, diodes and diffused resistors, to name a few. Devices which may be formed within the dielectric include thin-film resistors and capacitors. Silicon or silicon comprising material is typically used as the substrate for these devices.

Typically, more than 100 integrated circuit die (IC chips) are constructed on a single 8-inch diameter silicon wafer. The devices are interconnected by conductor paths (also referred to as metalization layer) formed within the dielectric. Typically, two or more levels of conductor paths, with successive levels separated by a dielectric layer, are employed as interconnections. In current practice, metalization layers, typically made of copper, are formed on dielectric layers to establish the conductor paths. Examples of processing methods to form the metalization layers include chemical vapor deposition (CVD), physical vapor deposition (PVD), and electrochemical deposition. Electrochemical deposition of copper has been found to provide the most cost-effective manner in which to deposit a copper metalization layer. In addition to being economically viable, such deposition techniques provide substantially conformal copper films that are mechanically and electrically suitable for interconnect structures.

An example of an electrochemical deposition is described (FIGS. 1A-1E). First, an electroless copper plated layer 102 is formed on an insulating layer 104 of a substrate 106, which may include thereon conductive features or devices 108 (FIG. 1A). The insulating layer 104 includes through holes or vias 110 to enable connection to the conductive features 108. The insulating layer 104 is typically an insulating layer which is interposed between conductor patterns formed on multiple layers for the purpose of ensuring the electrical insulation between the conductor patterns.

Next, a layer of photoresist layer 112 is patterned on the electroless copper plated layer 102 as shown in FIG. 1B. Next, an electrolytic copper plated layer 114 is formed on the exposed electroless copper plated layer 102 as shown in FIG. 1C. The electroless copper plated layer 102 is used as an electrical feed or seed layer for the electrolytic plating layer 114.

Next, the photoresist layer 112 is removed as shown in FIG. 1D. Next, the exposed electroless copper plated layer 102 is removed as shown in FIG. 1E by using a copper etching solution. Typically, an alkali etching solution is used as the etching solution. Due to the foregoing, a conductor pattern 116, in which the electrolytic copper plated layer 114 is laminated on the electroless copper plated layer 102, can be formed on the insulating layer 104. This process is typically repeated over and over for a formation of a multilayered device.

The current practice causes devices (e.g., printed circuit boards) to be fabricated with a long process throughput time because of the time consuming for film lamination to complete the patterning of the conductive layers. Layers of photoresist need to be used, layers of electroless plating and electrolytic plating have to be used, and removed at each step. In addition, various control systems are needed for chemical solutions to maintain line stability, for instance, in electroless plating process there is a need to control accurately and carefully the amount to be deposited and as well as controlling the thickness of the electroless plating. The fabrication process for devices thus becomes time consuming and costly.

BRIEF DESCRIPTION OF THE DRAWINGS

The embodiments of the present invention are illustrated by way of example and not by way of limitation in the figures of the accompanying drawings in which like references indicate similar elements. The invention may best be understood by referring to the following description and accompanying drawings that are used to illustrate embodiments of the invention. It should be noted that references to "an" or "one" embodiment of the invention in this disclosure are not necessarily to the same embodiment, and they mean at least one. In the drawings:

FIGS. 1A-1E illustrate an example of a current practice of forming a conductor path for a device using electrochemical process;

FIGS. 2A-2E illustrate an exemplary method of forming a conductor path in accordance to the embodiments of the present invention.

DETAILED DESCRIPTION

Figure 3A:
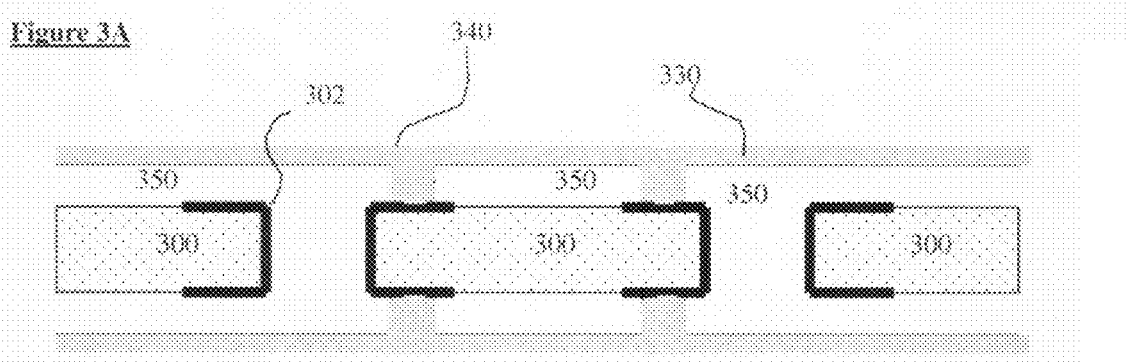
FIGS. 3A-3D illustrate another exemplary method of forming a conductor path in accordance to the embodiments of the present invention.

Exemplary embodiments are described with reference to specific configurations and techniques. Those of ordinary skill in the art will appreciate the various changes and modifications to be made while remaining within the scope of the appended claims. Additionally, well known elements, devices, components, circuits, process steps and the like are not set forth in detail.

Exemplary embodiments of the present invention pertain to a conductive lithographic polymer and method of fabricating devices (e.g., a printed circuit board) with interconnection and conductive features incorporating the conductive lithographic polymer. Conductive traces and conductive paths are used throughout fabrication processes of devices. For examples, devices are formed on substrates and are interconnected to one another through insulation layers and conductive paths or metalization layers. As previously discussed, electrochemical is one of the well-known methods that are widely practiced for making such conductive paths. The conventional methods commonly require multiple etching and lithographic steps in fabricating the conductive paths for the semiconductor devices. The currently practice requires long throughput time and incurs extensive cost for making the devices.

Exemplary embodiments of the present invention disclose a conductive lithographic polymer that can be used to fabricate conductive paths, metalization layers or other conductive features for the semiconductor devices. As used herein, a conductive lithographic polymer can be a synthetic material that includes an intrinsically conductive polymer and a polymer having optical properties. A conductive lithographic polymer can also be a material that includes a lithographic polymer and a conducting polymer that includes a physical mixture of a nonconductive polymer with a conducting material such as a metal or carbon power. A conductive lithographic polymer can also be a material that includes a lithographic polymer and a conducting polymer that includes a physical mixture of a conductive polymer with additional conducting material such as a metal or carbon power added to the mixture to enhance the conductivity of the conductive polymer. The conductive lithographic polymer can be used as a photoresist material due to its optical properties. Normal lithographic methods can be used to pattern the conductive lithographic polymer. The lines, traces, or paths formed using the conductive lithographic polymer can then be used as conductive traces or paths, or metalization layers due to its conductive properties. The conductive lithographic polymer thus may replace the ordinary photoresist layer plus the electroless plating layer previously mentioned or may replace the ordinary photoresist layer, the electroless plating layer, and the electrolytic plating layer previously mentioned. The conductive lithographic polymer may also be used to form other conductive traces and/or metalization layers currently being formed using metals such as copper.

In one embodiment, the conductive lithographic polymer is a mixture that comprises of (1) about 50% to about 60% (weight percentage) of a mixture of epoxy acrylate, a thermal curing agent, and a conductive polymer; (2) about 20% to about 30% (weight percentage) of a lithographic reactive component; (3) about 10% to about 15% (weight percentage) of a photo-active material; and (4) about 3% to about 5% (weight percentage) of additives that enhance or serve other function conductivity of the conductive photolithographic polymer.

The ratio of epoxy acrylate, a thermal curing agent, and a conductive polymer may be varied depending on the desired level of conductivity of the conductive lithographic polymer and the conductivity of the conductive polymer used for the mixture.

In one embodiment, the thermal curing agent is selected from a group consisting of imidazole, imidazole derivative, 2-methylimidazole, 2-ethylimidazole, 2-ethyl-4-methylimidazole, 2-phenylimidazole, 4-phenylimidazole, 1-cyanoethyl-2-phenylimidazole, 1-(2-cyanoethyl)-2-ethyl-4-methylimidazole, guanamine, acetoguanamine, benzoguanamine, amine, dicyandiamide, benzyldimethyl amine, 4-(dimethylamino)-N,N-dimethylbenzyl amine, 4-methoxy-N,N-dimethylbenzyl amine, 4-methyl-N,N-dimethylbenzyl amine, melamine, phenolic resin, phenol novolak resin, and cresol novolak resin.

In one embodiment, the conductive polymer is inherently or naturally conductive. In one embodiment, the conductive polymer is selected from a group consisting of polyaniline, polypyrrole, and polythiophene, polyphenylenevinylene, polydialkylfluorene, polyaniline derivatives, polypyrrole derivatives, polythiophene, derivatives, and a nanocomposite polymer. The conductive material can also be Iodine (AsF5), polyacetylene, or poly sulfur nitride with dopant.

In one embodiment, the lithographic reactive component is a monomer, a dimer, or a short chain oligomer having ethylenic unsaturation. The lithographic reactive component may be selected from a group consisting of styrene maleic anhydride copolymers, and similar anhydride-containing copolymers, wherein each of the styrene maleic anhydride copolymer, and the similar anhydride-containing copolymers is partially esterified with hydroxy-functional (meth)acrylic esters. In one embodiment, the hydroxy-functional (meth)acrylic esters is selected from a group consisting of hydroxyethyl acrylate, acrylic acid, methacrylic acid, maleic acid, fumaric acid, and citraconic acid functional monomers.

In one embodiment, the photo-active material is selected from a group consisting of 9-phenylacridine, n-phenyl glycine, aromatic ketones, N,N'-tetraethyl-4,4'-diaminobenzophenone, and 4-methoxy-4'-dimethylaminobenzophenone. The aromatic ketones can be benzophenone, N,N'-tetramethyl-4, or 4'-diaminobenzophenone.

A surfactant may also be included in the additives. In one embodiment, the additives are selected from a group consisting of a color former, a surfactant, a catalyst, a filler, a plasticizer, and a metal powder. The additives can be component that will enhance the conductivity of the polymer. Materials that can be used as additives also include a conductive agents, metals, metal powders, and nanosize metal powders. The conductive materials can be copper, gold, titanium, chromium, aluminum, iron, nickel, cobalt, zinc, copper zinc, nickel-iron, cobalt-iron, silver, Graphite, or carbon black powder, etc.

A solvent is included in the mixture that makes the conductive lithographic polymer. The solvent can be selected from various types of suitable organic solvents including a hydrocarbon solvent or an alcohol. The organic solvent can also be selected from a group consisting of ketone, methyl ethyl ketone, cyclohexanone, aromatic hydrocarbon, toluene, xylene, tetramethyl benzene, glycol ether, diethylene glycol monoethyl ether, dipropylene glycol diethyl ether, ester, ethyl acetate, butyl acetate, butyl cellosolve acetate, carbitol acetate, aliphatic hydrocarbon, octane, decane, petroleum solvent, petroleum ether, petroleum naphtha, and solvent naphtha.

The conductive photolithographic polymer has a conductivity comparable to that of a conductive metal such as copper, iron, nickel, cobalt, zinc, copper zinc, nickel-iron, or cobalt-iron. The conductivity of the conductive photolithographic polymer can be brought up the conductivity of these conductive metals by varying the concentration of the additives or the metal powder. In one embodiment, the conductivity of the conductive photolithographic polymer ranges from about $1\times10^{-10}$ to about $1\times10^6$ Siemens per centimeter. Generally, copper has a conductivity level of about $1\times10^6$ Siemens per centimeter and a semiconductor material has a conductivity level of about $1\times10^8$ Siemens per centimeter to about $1\times10^2$ Siemens per centimeter.

Films, patterns, or lines formed using the conductive lithographic polymer can be achieved using lithographic techniques currently used in device fabrication. Standard lithographic printing technology can be used to fabricate films, lines, or patterns of the conductive lithographic polymer on various substrates. After the fabrication, these films, lines, or patterns of the conductive lithographic polymer may form conductive features or metalization for various semiconductor or electronic devices. The conductive lithographic polymer can be formed on a substrate from an ink, a solution, or a dry film with a deposition, printing, or lamination process. The conductive lithographic polymer can be used in the fabrication of an electronic device, a micro-electronic device, a microprocessor, a chipset, an electrical controller, a printed circuit board, an electrical appliance, an optical coupler, an optoelectronic component, a display component, a liquid crystal display, or a flat panel display, etc., which may all use the conductive lithographic polymer in their circuitry.

In one embodiment, an electronic device such as a printed circuit board is formed using a conductive lithographic polymer such as those previously described. It is to be noted that the exemplary mixtures of the conductive lithographic polymer previously mentioned are not the only components that can be used for the conductive lithographic polymer used in making the electronic device. The fabrication of an electronic device that may benefit from the conductive photolithographic polymer will be described with reference to FIGS. 2A-2D.

First, an insulating layer 250 having an opening 240 as a via or a through hole is formed on each of both (top and bottom) surfaces of a core substrate 200 (FIG. 2A). The substrate 200 can be any desired substrate such as an organic material, ceramic, glass, or semiconductor material such as silicon, silicon containing material, silicon on insulation material, silicon germanium material. The substrate 200 may include microelectronic structures such as transistors or integrated circuits (not shown) formed thereon or therein.

The substrate 200 also includes conductive features 202. The conductive features 202 can be formed on the top surface, side surfaces, and bottom surface of the substrate 200. The conductive features 202 can be a conductive contact or contacts or metalization layers for the devices (not shown) that have been formed in the substrate 200 such as a transistor or an integrated circuit using methods known in the art. The conductive contacts can be made of copper, titanium, aluminum, chromium, or other suitable conductive material.

The insulating layer 250 is a conventional dielectric or insulating material typically used in semiconductor devices. The insulating layer 250 is formed on the substrate 200 using conventional methods as is know in the art. Vias or through holes 240 are created into the insulating layer 250 so that electrical contacts can be established to the conductive features 202. The insulating layer 250 can be formed on both top and bottom surfaces of the substrate 200 depending on applications and devices.

Next, a conductive photolithographic film 230 is formed on a surface of the insulating layer 250 (FIG. 2A). In one embodiment, the conductive photolithographic film 230 is formed on both top and bottom surfaces of the insulating layer 250. In one embodiment, the conductive photolithographic film 230 is formed from an ink solution where the conductive photolithographic material is printed or laid down on the surface of the insulating layer 250. The printed conductive photolithographic material is then allowed to dry or cure to form the conductive photolithographic film 230. Alternatively, the conductive photolithographic film 230 is formed by laminating a dry film down onto the surface of the insulating layer 250. Pressure and temperature may be applied to cause the conductive photolithographic film 230 to flow into the vias or through holes 240 to contact the conductive features 202.

Next, the conductive photolithographic film 230 is masked (FIG. 2B with a mask 241) according to a desired circuit pattern for the film 230 using methods known in the art similar to masking a photoresist film. The conductive photolithographic film 230 is then exposed to light 245, for instance, at about 50-150 mJ/cm$^2$ as typically done in exposing a photoresist film. Then, the light exposed conductive photolithographic film 230 is developed to create the desired pattern of conductive photolithographic film. The unmasked portion of the conductive photolithographic film 230 is removed upon the development of the film 230 leaving the masked portion of the conductive photolithographic film 232 as shown in FIG. 2C. The developing solution can be a conventional developing solution used to develop a photoresist film as is known in the art, e.g., a 0.7-1.0% solution of sodium.

The conductive photolithographic film 232 may have a thickness similar to that of a typical electroless plating film used in conventional process for forming conductor paths as previously described. In one embodiment, the conductive photolithographic film 232 has a thickness between about 0.5 μm to about 10 μm.

The traces of the conductive photolithographic film 232 is also designed or configured such that all traces are connected to external poles (not shown) for electrolytic copper plating. The connecting traces are later on etched away after the electrolytic copper plating.

Next, an electrolytic plating film 234 is formed on the conductive photolithographic film 232 (FIG. 2D) using techniques known in the art. For example, the electrolytic plating film 234 can be formed by dipping the substrate 200 into an electrolytic plating liquid and flowing an electric current through the conductive photolithographic film 232. The electrolytic plating film 234 will be formed on the conductive photolithographic film 232. The electrolytic plating film 234 may have a thickness of about 5-30 μm. The electrolytic plating film 234 is typically an electrolytic plating copper film. In one embodiment, a solution comprising sulfuric acid of about 180 g/L and copper sulfate of about 80 g/L is used for the electrolytic plating process to form the electrolytic plating film 234. Together, the electrolytic plating film 234 and the conductive photolithographic film 232 form conductive patterns or circuit patterns 236 of the semiconductor device. In the embodiments where the conductive photolithographic film 232 is formed on the top and bottom surfaces of the substrate 200, the electrolytic plating film 234 may also be formed on both top and bottoms surfaces of the substrate 200 as shown in FIG. 2D. After the electrolytic plating, the traces connected to external poles used for the electrolytic plating are etched away using a conventional method.

The process illustrated FIGS. 2A-2D can be repeated as many times as necessary for forming additional layers of conducting patterns for a multilayer semiconductor devices. For instance, another insulation layer 247 can be formed on top of the substrate 200 and over the conductive patterns 236 as shown in FIG. 2E. Vias/holes 249 are created through the insulation layer to allow for connection to the conductive patterns 236 or other conductive features on the substrate 200. Then, the process described for forming the conductive photolithographic film and the electrolytic film previously described can be likewise repeated to create another desired circuit pattern.

In one embodiment, the conductive features 202 shown above can also be made from a conductive lithographic polymer. In the present embodiment, a conductive lithographic polymer such as those previously described (in the form of an ink or a dry film) is formed, deposited, or laminated on the substrate 200 to form a conductive lithographic polymer film. The conductive lithographic polymer film is then masked, exposed, and developed similar to previously described to form a desired circuit pattern for the conductive features 202. After the conductive lithographic polymer film is patterned, the conductive elements 202 are formed on the substrate 250. In the embodiment where the conductive lithographic polymer is laid down as a film, pressure and temperature may be applied to cause the conductive lithographic polymer film to flow into crevices, openings, trenches, or vias (not shown) on the substrate 200.

Figure 3B:
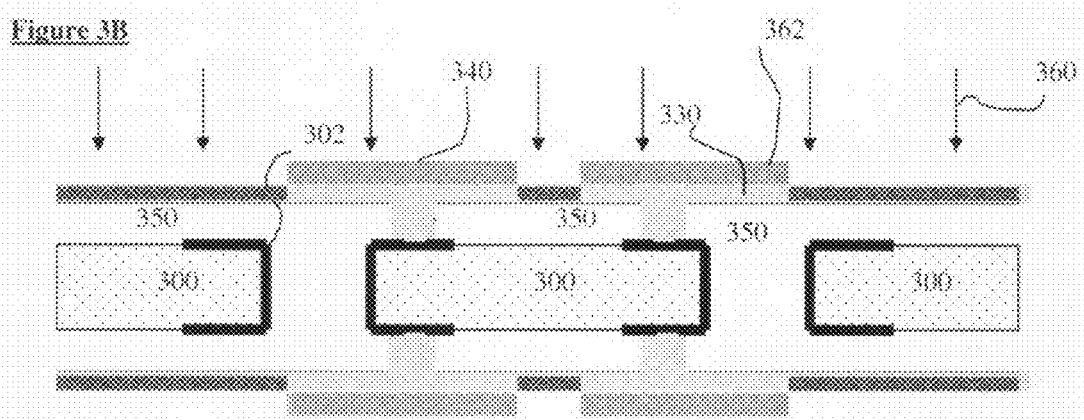
Figure 3C:
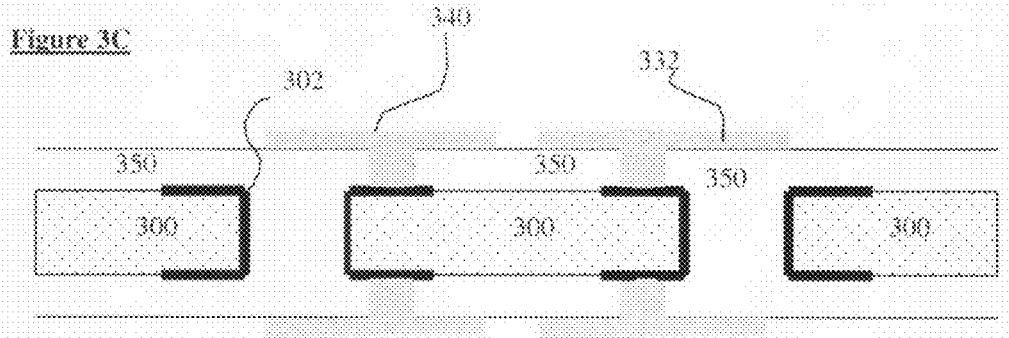

In the embodiments above, the conductive lithographic polymer is used to replace the electroless copper process and the photoresist process as used in the conventional method to form conductive patterns. In some other embodiments, a conductive lithographic polymer is used to replace the electroless copper plating, the photoresist, as well as the electrolytic copper plating as used in conventional methods of forming conducting patterns. FIGS. 3A-3C illustrate such embodiments. In these embodiments, a conductive lithographic polymer film is first formed on a surface of a substrate. The conductive lithographic polymer film is then masked, exposed, and developed to form a conducting pattern. The conductive lithographic polymer film is formed sufficiently thick and with sufficient conductivity so that the electrolytic plating is not necessary.

In FIG. 3A, an insulating layer 350 having an opening 340 as a via or a through hole is formed on a surface (as shown herein, each of the top and bottom surfaces) of a core substrate 300. The substrate 300 can be any desired substrate such as an organic material, ceramic, glass, or semiconductor material such as silicon, silicon containing material, silicon on insulation material, silicon germanium material. The substrate 300 may include microelectronic structures such as transistors or integrated circuits (not shown) formed thereon or therein. The substrate 300 also includes conductive features 302. The conductive features 302 can be formed on the top surface, side surfaces, and bottom surface of the substrate 300. The conductive features 302 can be a conductive contact or contacts or metalization layers for the devices (not shown) that have been formed in the substrate 300 such as a transistor or an integrated circuit using methods known in the art. The conductive contacts can be made of copper, titanium, aluminum, chromium, or other suitable conductive material.

Next, a conductive photolithographic film 330 is formed on a surface of the insulating layer 350. In one embodiment, the conductive photolithographic film 330 is formed on both top and bottom surfaces of the insulating layer 350. In one embodiment, the conductive photolithographic film 330 is formed from an ink solution where the conductive photolithographic material is printed or laid down on the surface of the insulating layer 350. The printed conductive photolithographic material is then allowed to dry or cure to form the conductive photolithographic film 330. Alternatively, the conductive photolithographic film 330 is formed by laminating a dry film down onto the surface of the insulating layer 350. Pressure and temperature may be applied to cause the conductive photolithographic film 330 to flow into the vias or through holes 340 to contact the conductive features 302. The conductive photolithographic material may fill into the openings, vias, trenches, or crevices after being formed on the insulating layer as shown in FIGS. 3A-3C.

Next, the conductive photolithographic film 330 is masked (FIG. 3B) with a mask 362 according to a desired circuit pattern for the film 330 using methods known in the art similar to masking a photoresist film. The conductive photolithographic film 330 is then exposed to light 360, for instance, at about 50-150 mJ/cm$^2$ as typically done in exposing a photoresist film. Then, the light exposed conductive photolithographic film 330 is developed to create the desired pattern of conductive photolithographic film. The unmasked portion of the conductive photolithographic film 330 is removed upon the development of the film 330 leaving the masked portion of the conductive photolithographic film 332 as shown in FIG. 3C. The developing solution can be a conventional developing solution used to develop a photoresist film as is known in the art, e.g., a 0.7-1.0% solution of sodium.

The conductive photolithographic film 332 may have a thickness similar to that of a typical electroless plating film plus a typical electroplating film used in conventional processes for forming conductor path as previously described. In one embodiment, the conductive photolithographic film 332 has a thickness between about 10 μm to about 100 μm.

Figure 3D:
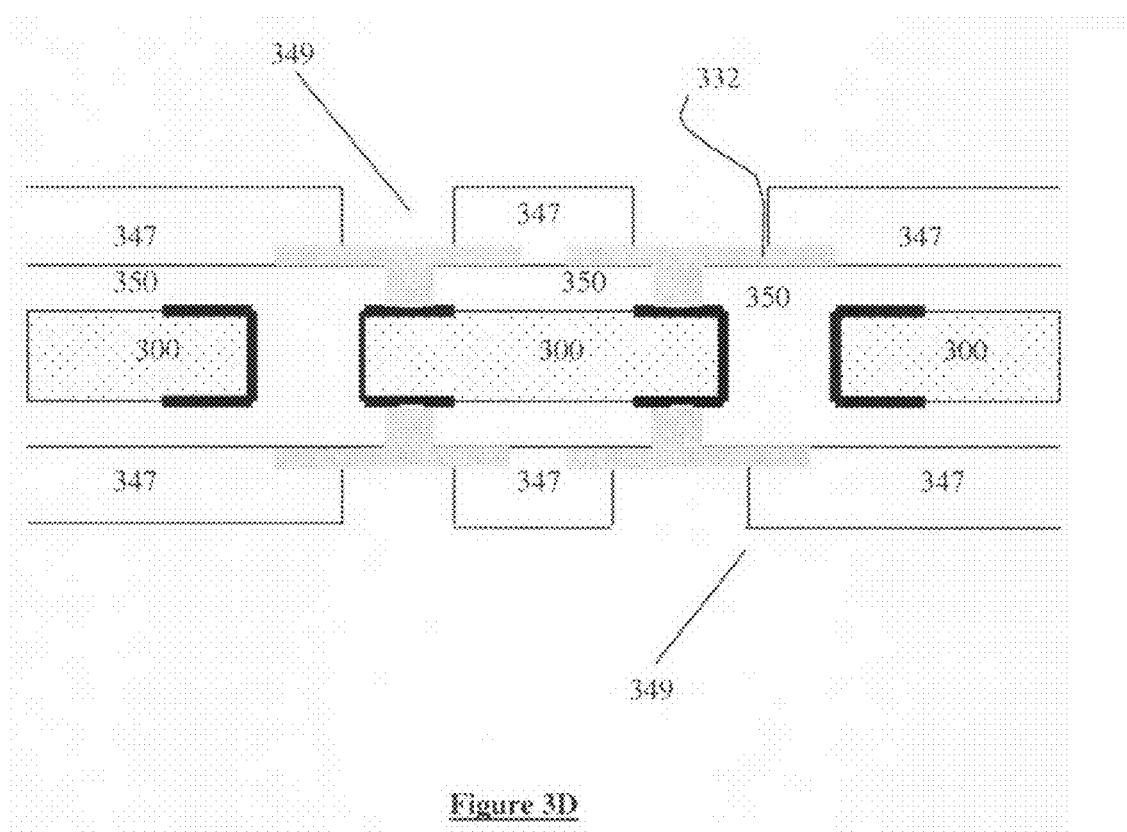

The process illustrated in 232 FIGS. 3A-3C can be repeated as many times as necessary for forming additional layers of conducting patterns for a multilayer semiconductor devices. For instance, as shown in FIG. 3D, another insulation layer 347 can be formed on top of the substrate 300 and over the conductive patterns 332. Vias/holes 349 are created through the insulation layer 347 to allow for connection to the conductive patterns 332 or other conductive features on the substrate 300. Then, the process described for forming the conductive photolithographic film can be likewise repeated to create another desired circuit pattern.

In one embodiment, the conductive features 302 show above are made from a conductive lithographic polymer. In the present embodiment, a conductive lithographic polymer such as those previously described (in the form of an ink or a dry film) is formed, deposited, or laminated on the substrate 300 to form a conductive lithographic polymer film. The conductive lithographic polymer film is then masked, exposed, and developed similar to previously described to form a desired circuit pattern for the conductive features 302. After the conductive lithographic polymer film is patterned, the conductive elements 302 are formed on the substrate 300. In the embodiment where the conductive lithographic polymer is laid down as a film, pressure and temperature may be applied to cause the conductive lithographic polymer film to flow into crevices, openings, trenches, or vias (not shown) on the substrate 300.

Embodiments of the present invention may be used to reduce the long process throughput time for semiconductor device fabrication caused by electroless and electrolytic processes. Additionally, the embodiments may allow for reducing of materials used in fabrication intermediate steps (e.g., photoresist material and electroless plating materials) typically used for coating and etching processes.

While the invention has been described in terms of several embodiments, those of ordinary skill in the art will recognize that the invention is not limited to the embodiments described. The method and apparatus of the invention, but can be practiced with modification and alteration within the spirit and scope of the appended claims. The description is thus to be regarded as illustrative instead of limiting.

Having disclosed exemplary embodiments, modifications and variations may be made to the disclosed embodiments while remaining within the spirit and scope of the invention as defined by the appended claims.

We claim:

1. An electronic device comprising:
    a substrate;
    a dielectric layer over the substrate;
    a patterned conductive photolithographic film over the dielectric layer, the patterned conductive photolithographic film having a portion that has been removed, wherein the patterned conductive photolithographic film is patterned by development, and wherein the patterned conductive photolithographic film has a characteristic that it is not removed during the development, and wherein the patterned conductive photolithographic film comprises a reaction product of an epoxy acrylate; and
    a metal film plated on the patterned conductive photolithographic film.

2. An electronic device comprising:
    a substrate;
    a dielectric layer over the substrate;

a patterned conductive photolithographic film over the dielectric layer, the patterned conductive photolithographic film having a portion that has been removed, wherein the patterned conductive photolithographic film comprises a photo-active material, and wherein the photo-active material comprises at least one of 9-phenylacridine, n-phenyl glycine, aromatic ketones, N,N'-tetraethyl-4,4'-diaminobenzophenone, and 4-methoxy-4'-dimethylaminobenzophenone; and a metal film plated on the patterned conductive photolithographic film.

* * * * *